United States Patent
Chang et al.

(10) Patent No.: US 11,062,650 B2
(45) Date of Patent: Jul. 13, 2021

(54) SENSING CIRCUIT AND A SOURCE DRIVER OF A DISPLAY DEVICE

(71) Applicant: Novatek Microelectronics Corp., Hsinchu (TW)

(72) Inventors: Chih-Yuan Chang, Hsinchu County (TW); Feng-Lin Chan, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/576,776

(22) Filed: Sep. 20, 2019

(65) Prior Publication Data

US 2021/0090498 A1    Mar. 25, 2021

(51) Int. Cl.
*G09G 3/3233* (2016.01)
*H03F 3/393* (2006.01)

(52) U.S. Cl.
CPC ........... *G09G 3/3233* (2013.01); *H03F 3/393* (2013.01); *G09G 2300/043* (2013.01); *G09G 2310/0291* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,703,283 A | * | 10/1987 | Samuels | H03F 3/38 330/10 |
| 9,307,928 B1 | * | 4/2016 | Al-Ali | A61B 5/7405 |
| 9,998,079 B2 | | 6/2018 | Splithof | |
| 10,522,077 B2 | | 12/2019 | Woo et al. | |
| 2005/0225683 A1 | * | 10/2005 | Nozawa | G09G 3/3233 348/801 |
| 2005/0239422 A1 | * | 10/2005 | Jafari | H04B 1/0475 455/126 |
| 2008/0191800 A1 | | 8/2008 | Fang et al. | |

(Continued)

FOREIGN PATENT DOCUMENTS

| | | |
|---|---|---|
| CN | 107395145 | 11/2017 |
| TW | 201721622 | 6/2017 |

OTHER PUBLICATIONS

"Office Action of Taiwan Counterpart Application", dated Jun. 23, 2020, p. 1-p. 10.

*Primary Examiner* — Van N Chow
(74) *Attorney, Agent, or Firm* — JCIPRNET

(57) ABSTRACT

A sensing circuit of a display device is provided. The sensing circuit includes a chopper circuit, a first operational amplifier and a filter. The chopper circuit is configured to receive a sensing input signal of the display device and modulate the sensing input signal. The first operational amplifier is coupled to the chopper circuit. The first operational amplifier is configured to receive the modulated sensing input signal and output the modulated sensing input signal to the chopper circuit. The chopper circuit is further configured to demodulate the modulated sensing input signal from the first operational amplifier and output the demodulated sensing input signal. The filter is coupled to the chopper circuit. The filter is configured to filter the demodulated sensing input signal from the chopper circuit and output the filtered sensing input signal as a sensing output signal. A source driver including the sensing circuit is also provided.

18 Claims, 11 Drawing Sheets

(56) References Cited

U.S. PATENT DOCUMENTS

2014/0313157 A1* 10/2014 Ahn .................... G06F 3/0446
                                                      345/174
2017/0154573 A1   6/2017 Woo et al.
2017/0214864 A1*  7/2017 Izuha .................... H04N 5/341
2017/0310290 A1  10/2017 Splithof

* cited by examiner

SENSING CIRCUIT AND A SOURCE DRIVER OF A DISPLAY DEVICE

BACKGROUND

Technical Field

The invention relates to an electrical circuit and a driver circuit of a display device, and more particularly, relates to a sensing circuit and a source driver of a display device.

Description of Related Art

With the rapid advance and continual progress in technology, the organic light-emitting diode (OLED) technology has been provided and widely used in various applications such as TV, computer monitor, notebook computer, mobile phone or PDA. In general, the OLED display includes many OLED pixel circuits arranged in the form of a matrix, and each OLED pixel circuit includes an OLED element and a corresponding driving circuit. However, pixels of the conventional OLED device are controlled by thin-film transistors (TFT). Consequently, the pixels of the conventional OLED device inherit the disadvantages of the TFTs and would be aged along with using time.

The TFTs drive the OLED devices with different data inputs. When the TFTs decay, the driving currents may be inconsistent even if the data inputs are the same. The inconsistent driving currents will interfere the luminescence properties of the OLED devices. In addition, the OLED devices would be aged along with using time, such that the luminescence properties are also different even if the diode currents are the same. The problems to be solved are burn-in and color degradation of the OLED devices.

The common methods for compensating burn-in and color degradation of the OLED devices includes an internal compensation and an external compensation. The internal compensation is mainly developed for compensating threshold voltages of the TFTs. On the other hand, an additional sensing circuit is necessary for the external compensation. The sensing circuit measures electrical characteristics of pixels, and the OLED devices are compensated based on the measurement result. However, the measurement result may be affected by noise and/or offset voltages of the sensing circuit.

Therefore, how to effectively measure electrical characteristics of pixels is an important issue for persons skilled in the art.

SUMMARY

The invention is directed to a sensing circuit and a source driver of a display device, which are capable of effectively measuring electrical characteristics of pixels.

The invention provides a sensing circuit of a display device. The sensing circuit includes a chopper circuit, a first operational amplifier and a filter. The chopper circuit is configured to receive a sensing input signal of the display device and modulate the sensing input signal. The first operational amplifier is coupled to the chopper circuit. The first operational amplifier is configured to receive the modulated sensing input signal and output the modulated sensing input signal to the chopper circuit. The chopper circuit is further configured to demodulate the modulated sensing input signal from the first operational amplifier and output the demodulated sensing input signal. The filter is coupled to the chopper circuit. The filter is configured to filter the demodulated sensing input signal from the chopper circuit and output the filtered sensing input signal as a sensing output signal.

The invention provides a source driver of a display device. The source driver includes a sensing circuit. The sensing circuit is configured to receive a sensing input signal of the display device. The sensing circuit includes a chopper circuit, a first operational amplifier and a filter. The chopper circuit is configured to receive a sensing input signal of the display device and modulate the sensing input signal. The first operational amplifier is coupled to the chopper circuit. The first operational amplifier is configured to receive the modulated sensing input signal and output the modulated sensing input signal to the chopper circuit. The chopper circuit is further configured to demodulate the modulated sensing input signal from the first operational amplifier and output the demodulated sensing input signal. The filter is coupled to the chopper circuit. The filter is configured to filter the demodulated sensing input signal from the chopper circuit and output the filtered sensing input signal as a sensing output signal.

In an embodiment of the invention, the chopper circuit includes a first chopper and a second chopper. The first chopper is configured to receive the sensing input signal of the display device and modulate the sensing input signal. The second chopper is coupled to the first operational amplifier. The second chopper is configured to demodulate the modulated sensing input signal from the first operational amplifier and output the demodulated sensing input signal to the filter. The first operational amplifier is coupled between the first chopper and the second chopper.

In an embodiment of the invention, the chopper circuit includes a first output chopper. The first output chopper demodulates the modulated sensing input signal from the first operational amplifier and outputs the demodulated sensing input signal to the filter.

In an embodiment of the invention, the first operational amplifier has a first end and a second end. The first end is coupled to a first voltage. The first end receives the sensing input signal of the display device. The second end is coupled to a second voltage. The first voltage and the second voltage are switched to modulate the sensing input signal of the display device.

In an embodiment of the invention, the sensing input signal is outputted from a pixel of the display device via a sensing line of the display device. The pixel includes a driving transistor. The sensing input signal is a current outputted from the driving transistor.

In an embodiment of the invention, the chopper circuit further includes a first input chopper. The first input chopper modulates the sensing input signal of the display device and outputs the modulated sensing input signal to the first operational amplifier.

In an embodiment of the invention, the sensing input signal is outputted from a pixel of the display device via a data line of the display device. The pixel includes a driving transistor and an organic light-emitting diode. The sensing input signal is a current outputted from the driving transistor or a current inputted to the organic light-emitting diode.

In an embodiment of the invention, the chopper circuit further includes a second input chopper and a second output chopper. The filter includes a second operational amplifier coupled between the second input chopper and the second output chopper. The second input chopper modulates the demodulated sensing input signal from the first output chopper and outputs the modulated sensing input signal to the second operational amplifier. The second operational amplifier receives the modulated sensing input signal from the second input chopper and outputs the modulated sensing input signal to the second output chopper. The second output chopper demodulates the modulated sensing input signal from the second operational amplifier and outputs the demodulated sensing input signal.

The invention provides a sensing circuit of a display device. The sensing circuit includes an operational amplifier and a chopper circuit. The operational amplifier is configured to receive a sensing input signal of the display device and output the sensing input signal. The chopper circuit is coupled to the operational amplifier. The chopper circuit is configured to modulate and demodulate the sensing input signal to reduce an offset voltage and a noise signal of the operational amplifier.

In an embodiment of the invention, the sensing circuit further includes a filter. The filter is coupled to the chopper circuit. The filter is configured to filter the sensing input signal from the chopper circuit and output the filtered sensing input signal as a sensing output signal.

In an embodiment of the invention, the sensing input signal is outputted from a pixel of the display device via a data line or a sensing line of the display device. The pixel includes a driving transistor and an organic light-emitting diode. The sensing input signal is a current outputted from the driving transistor or a current inputted to the organic light-emitting diode.

In an embodiment of the invention, the sensing circuit is disposed in a source driver of the display device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
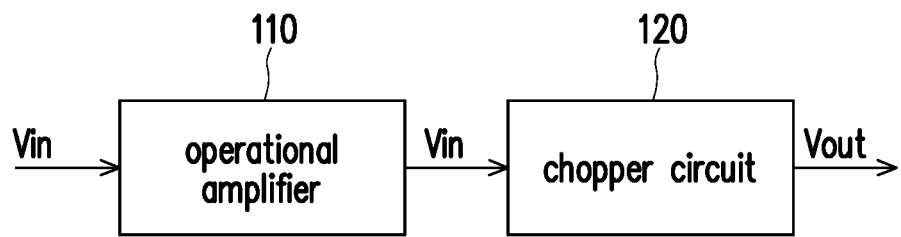
FIG. 1 illustrates a schematic diagram of a sensing circuit of a display device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments are provided below to describe the disclosure in detail, though the disclosure is not limited to the provided embodiments, and the provided embodiments can be suitably combined. The term "coupling/coupled" used in this specification (including claims) of the application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

FIG. 1 illustrates a schematic diagram of a sensing circuit of a display device according to an embodiment of the invention. Referring to FIG. 1, the sensing circuit 100 of the present embodiment includes an operational amplifier 110 and a chopper circuit 120. The chopper circuit 120 is coupled to the operational amplifier 110. The operational amplifier 110 is configured to receive a sensing input signal Vin of a display device and amplify and output the sensing input signal Vin to the chopper circuit 120. The chopper circuit 120 is configured to modulate and demodulate the sensing input signal Vin to generate a sensing output signal Vout, so that an offset voltage and a noise signal from the operational amplifier 110 are reduced.

Figure 2:
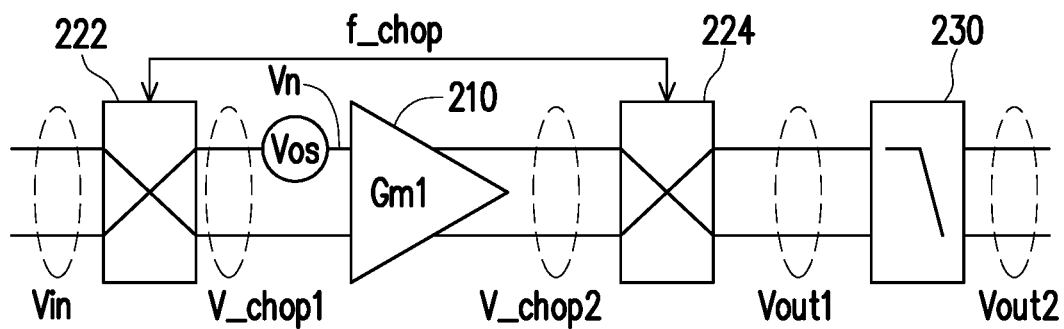
FIG. 2 illustrates a schematic diagram of a sensing circuit of a display device according to another embodiment of the invention.
Figure 3B:
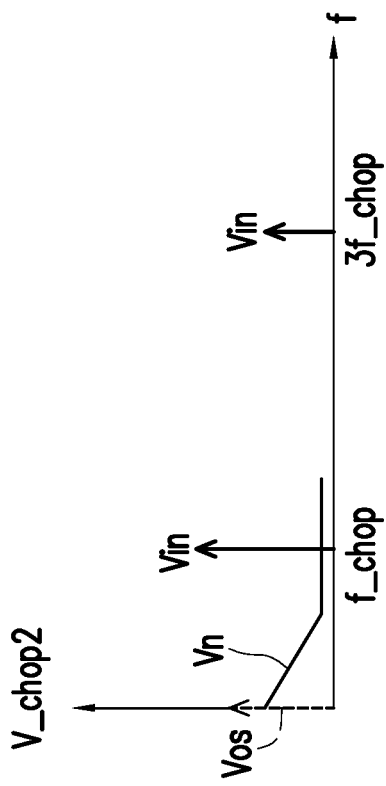
FIG. 3A, FIG. 3B, FIG. 3C and FIG. 3D respectively illustrate waveform diagrams of different signals depicted in FIG. 2.
Figure 3D:
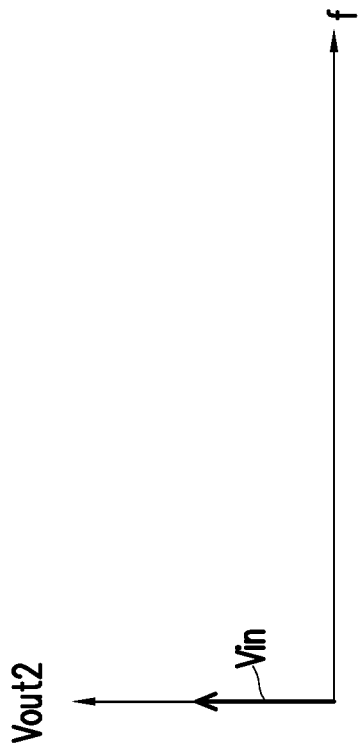

FIG. 2 illustrates a schematic diagram of a sensing circuit of a display device according to another embodiment of the invention. FIG. 3A to FIG. 3D respectively illustrate waveform diagrams of different signals depicted in FIG. 2. The horizontal axis of FIGS. 3A to 3D is the frequency f. Referring to FIG. 2 to FIG. 3D, the sensing circuit 200 of the present embodiment includes an operational amplifier 210, a chopper circuit 220 and a filter 230. The chopper circuit 220 is configured to modulate the sensing input signal Vin of a display device and demodulate the modulated sensing input signal V_chop2 from the operational amplifier 210 to reduce an offset voltage Vos and a noise signal Vn of the operational amplifier 210. Gm1 is the gain of the operational amplifier 210.

Figure 3A:
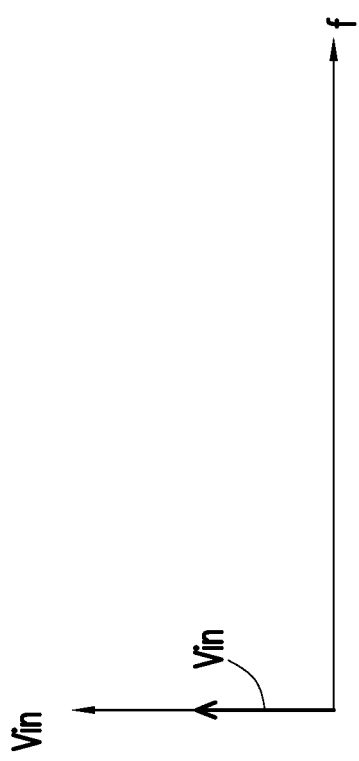

To be specific, the chopper circuit 220 includes a first chopper 222 and a second chopper 224. The operational amplifier 210 is coupled between the first chopper 222 and the second chopper 224. The first chopper 222 serves as an input chopper and receives a sensing input signal Vin of a display device. The sensing input signal Vin may be a direct current (DC) signal as shown in FIG. 3A. The first chopper 222 modulates the sensing input signal Vin with a predetermined frequency f_chop and outputs the modulated sensing input signal V_chop1 to the operational amplifier 210. The operational amplifier 210 receives and amplifies the modulated sensing input signal V_chop1 and outputs the modulated sensing input signal V_chop2 to the second chopper 224. The operational amplifier 210, for example, has an offset voltage Vos, and a noise signal Vn is inputted to the operational amplifier 210. As shown FIG. 3B, by modulation, the first chopper 222 converts the sensing input signal Vin into odd harmonic signals with frequencies f_chop, 3f_chop, . . . , and so on. Since the offset voltage Vos and the noise signal Vn are not modulated by the first chopper 222, their frequencies remain unchanged.

Figure 3C:
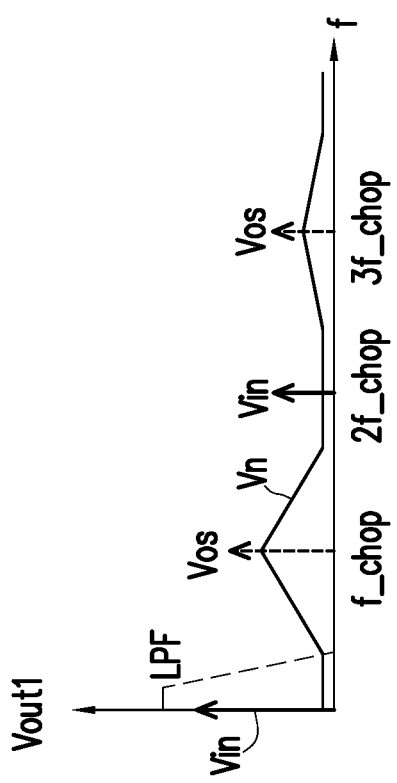

The second chopper 224 receives the modulated sensing input signal V_chop2 from the operational amplifier 210. The second chopper 224 serves as an output chopper. The second chopper 224 demodulates the modulated sensing input signal V_chop2 and outputs the demodulated sensing input signal Vout1 to the filter 230. By demodulation, the sensing input signal Vin is converted into a DC signal, and the offset voltage Vos and the noise signal Vn are modulated to a high frequency zone. For example, the offset voltage Vos is converted into odd harmonic signals with frequencies f_chop, 3f_chop, . . . , and so on, as shown in FIG. 3C. As shown in FIG. 3C, frequency 2f_chop is an even harmonic signal. The filter 230 may be a low-pass filter (LPF) in the present embodiment. The filter 230 filters the offset voltage Vos and the noise signal Vn located in the high frequency zone from the demodulated sensing input signal Vout1, and then outputs the filtered sensing input signal Vout2 as a sensing output signal. Therefore, the offset voltage Vos and the noise signal Vn of the sensing output signal are reduced.

Figure 4A:
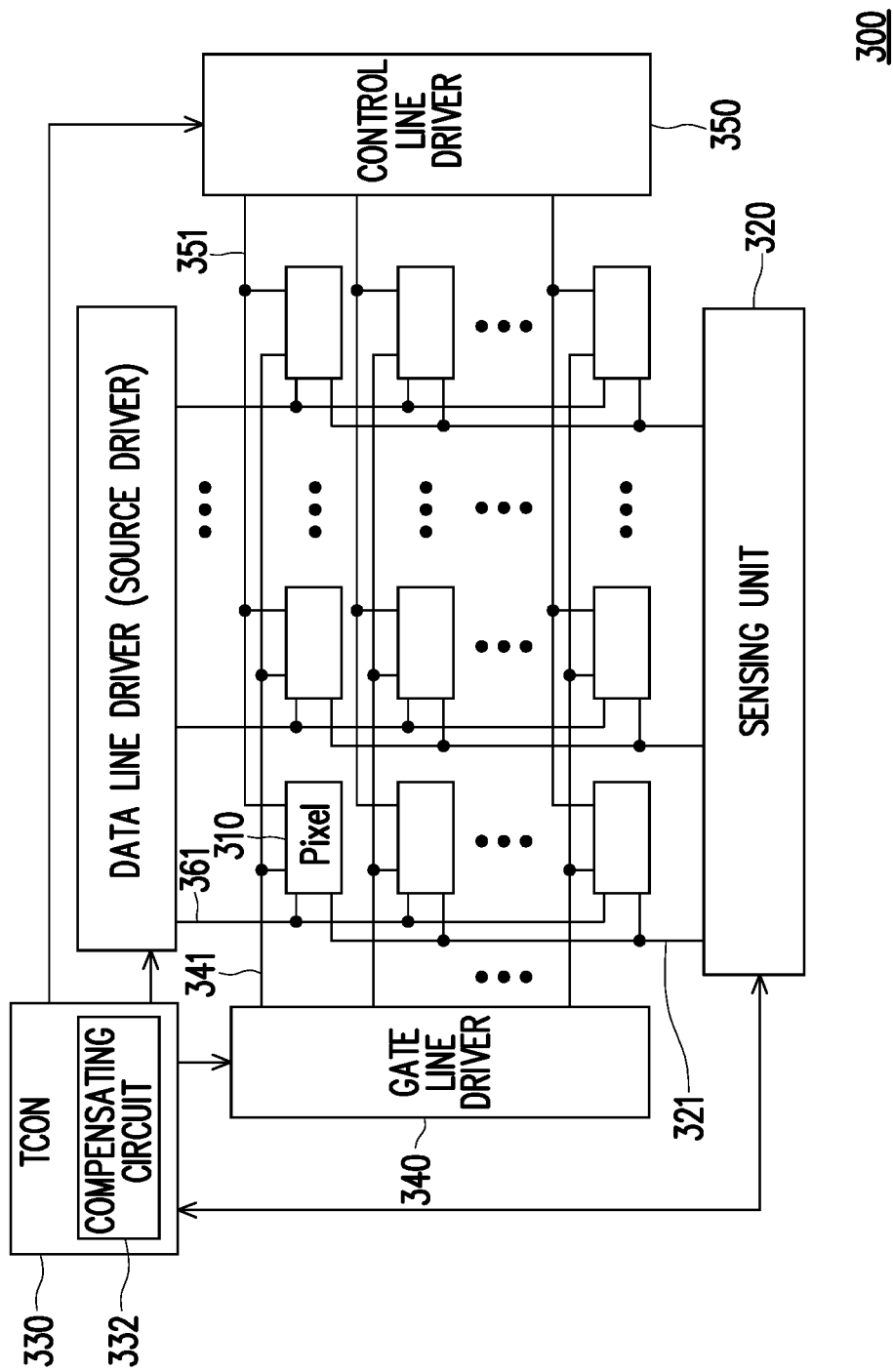
FIG. 4A illustrates a schematic diagram of a display device according to an embodiment of the invention.
Figure 4B:
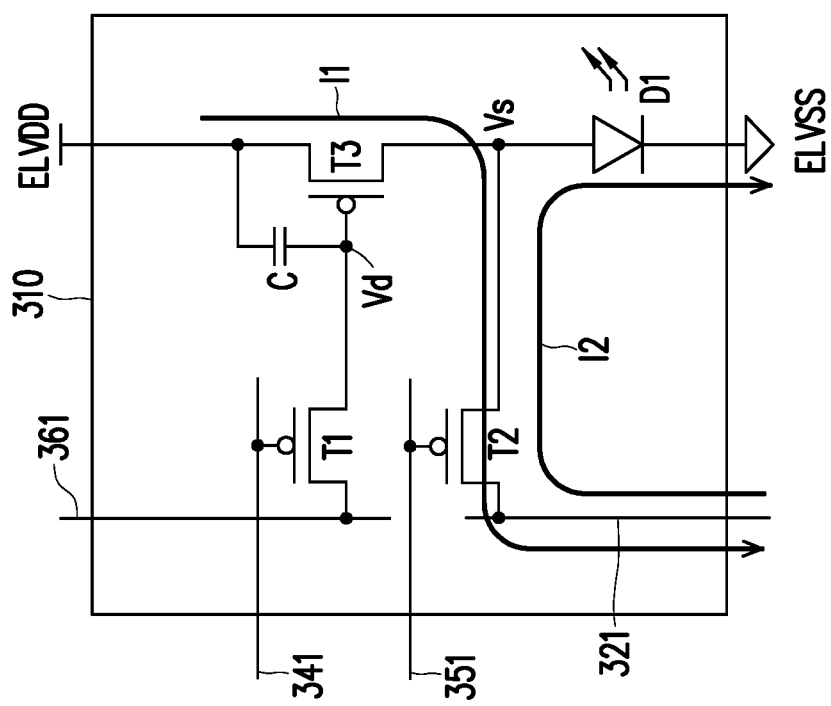
FIG. 4B illustrates a schematic diagram of a pixel depicted in FIG. 4A.

FIG. 4A illustrates a schematic diagram of a display device according to an embodiment of the invention. FIG. 4B illustrates a schematic diagram of a pixel depicted in FIG. 4A. Referring to FIG. 4A and FIG. 4B, the display device 300 may be an organic light-emitting diode (OLED) display. The display device 300 includes a plurality of pixels 310, a sensing unit 320, a timing controller 330, a gate line driver 340, a control line driver 350 and a data line driver (a source driver) 360. The timing controller 330 includes a compensating circuit 332.

In the present embodiment, enough teaching, suggestion, and implementation illustration for operations and circuit structures of the sensing unit 320, the timing controller 330, the gate line driver 340, the control line driver 350, the data line driver 360 and the compensating circuit 332 and embodiments thereof may be obtained with reference to common knowledge in the related art.

In the present embodiment, the pixel 310 includes a first transistor T1, a second transistor T2, a third transistor T3 (a driving transistor) and an organic light-emitting diode D1. Voltages ELVDD and ELVSS provide power to the pixel 310. The gate line driver 340 and the control line driver 350 control conduction states of the first transistor T1 and the second transistor T2 via a gate line 341 and a control line 351, respectively.

When the first transistor T1 is conducted, the data line driver 360 transmits a pixel data Vd to the third transistor T3 via a data line 361. When the second transistor T2 and the third transistor T3 are conducted, a current I1 is outputted from the third transistor T3 and transmitted to the sensing unit 320 via a sensing line 321. When the second transistor T2 is conducted and the third transistor T3 is not conducted, a current I2 is inputted to the organic light-emitting diode D1 from the sensing unit 320 via the sensing line 321. In the present embodiment, the sensing input signal Vin and the pixel data Vd are respectively transmitted in different signal lines, i.e. the sensing line 321 and the data line 361.

The sensing unit 320 includes one or more sensing circuits. Taking the sensing circuit 200 depicted in FIG. 2 for example, the sensing circuit 200 receives the sensing input signal Vin from the pixel 310 and outputs the sensing output signal Vout2 to the compensating circuit 332 for pixel data compensation. The sensing input signal Vin may be the current I1 outputted from the third transistor T3, the current I2 inputted to the organic light-emitting diode D1 and/or a sensing voltage Vs. The sensing circuit 200 can measure the information of the current I1, the current I2 and/or the sensing voltage Vs.

Figure 5:
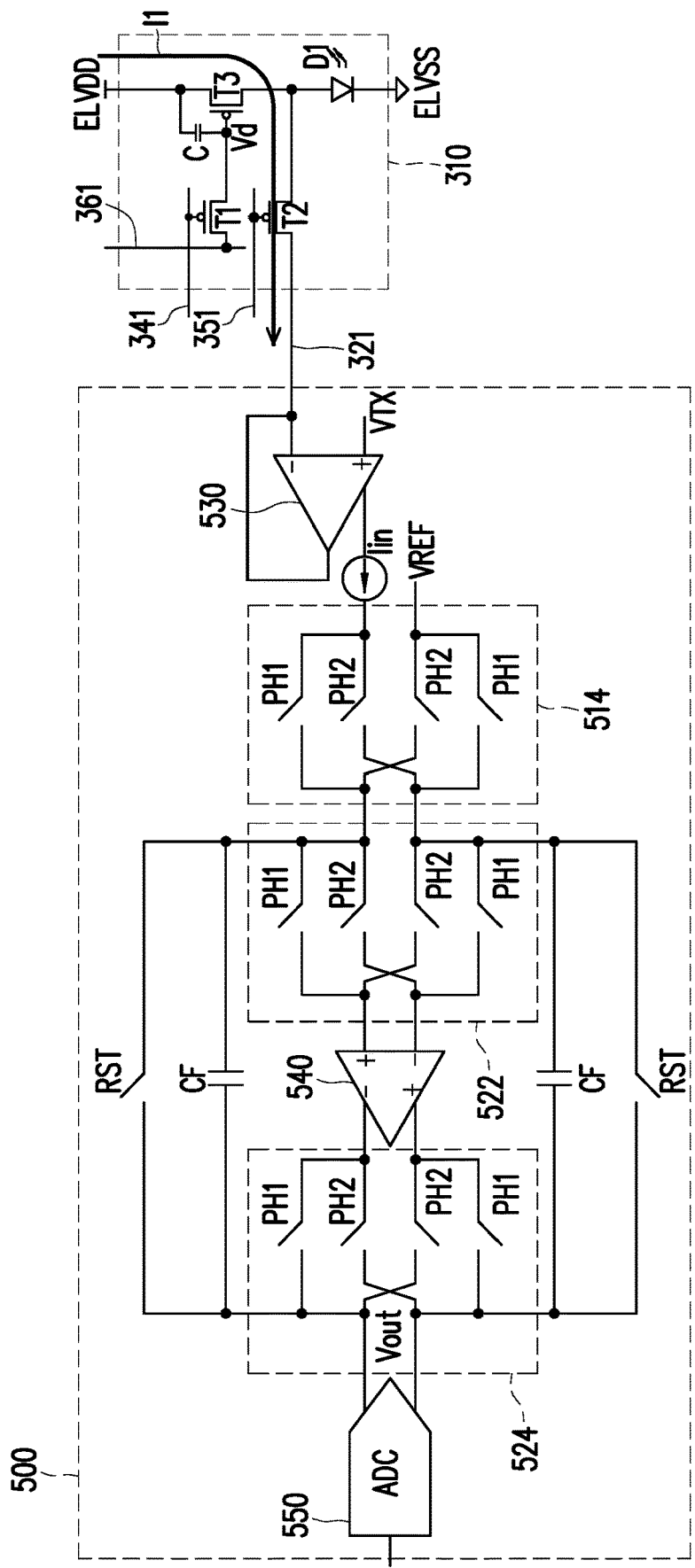
FIG. 5 illustrates a schematic diagram of a sensing circuit of a display device according to another embodiment of the invention.
Figure 6:
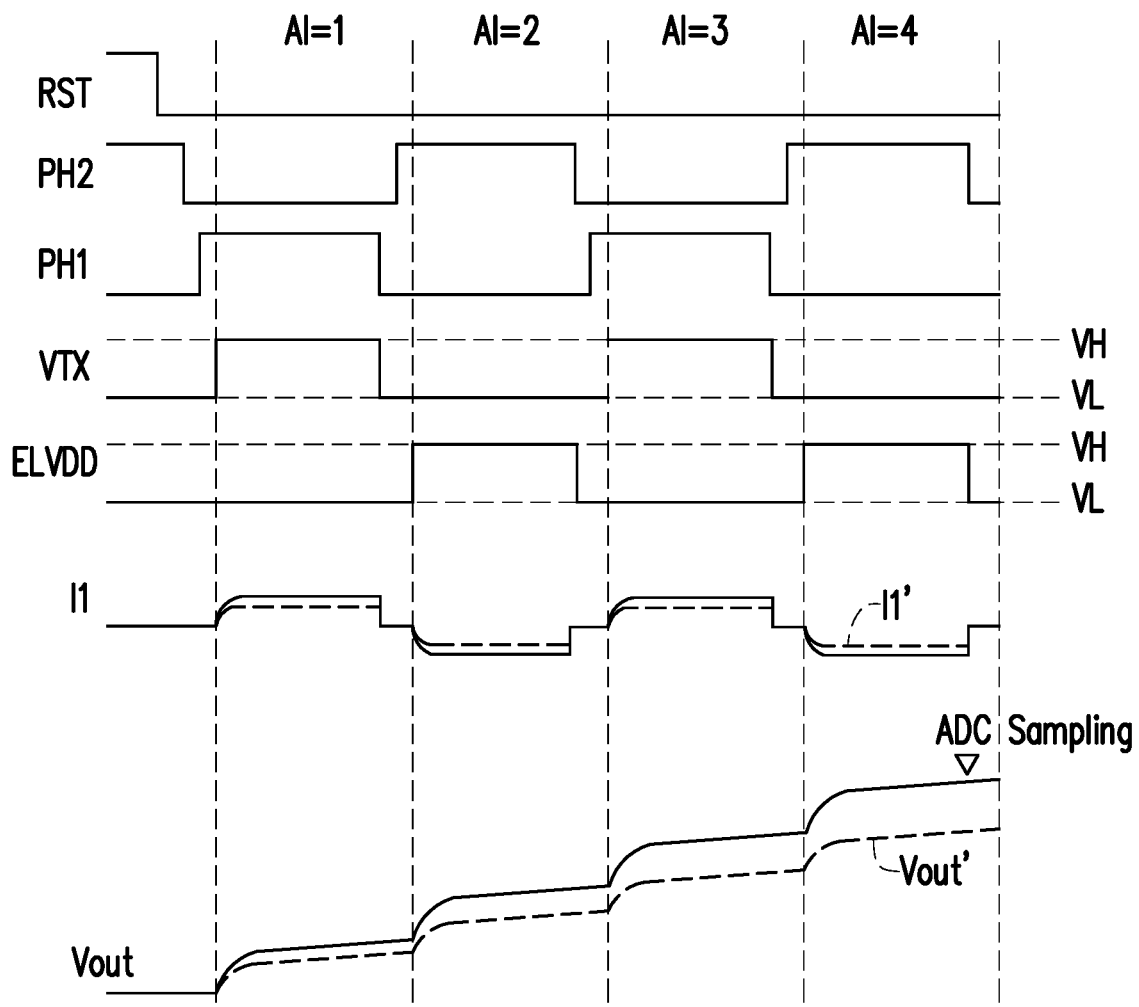
FIG. 6 illustrates waveform diagrams of different signals depicted in FIG. 5.

FIG. 5 illustrates a schematic diagram of a sensing circuit of a display device according to another embodiment of the invention. FIG. 6 illustrates waveform diagrams of different signals depicted in FIG. 5. Referring to FIG. 4A to FIG. 6, the sensing circuit 500 includes a first operational amplifier 530, a first output chopper 514, a second input chopper 522, a second output chopper 524, a second operational amplifier 540 and a signal converter 550. The sensing circuit 500 may be divided into two stage circuits in the present embodiment. The first stage circuit includes the first operational amplifier 530 and the first output chopper 514. The second stage circuit includes the second input chopper 522, the second output chopper 524 and the second operational amplifier 540. The second stage circuit functions as an integrator circuit and a filter. The filter includes the second operational amplifier 540 coupled between the second input chopper 522 and the second output chopper 524. CF is a capacitor.

Taking the current I1 outputted from the third transistor T3 as an example for the sensing input signal Vin, the sensing circuit 500 may be configured to sense the current I1 outputted from the third transistor T3. The first operational amplifier 530 has a first end and a second end. The first end is coupled to a first voltage ELVDD, and the second end is coupled to a second voltage VTX. The first voltage ELVDD and the second voltage VTX are between a high voltage VH and a low voltage VL. When the first transistor T1 is conducted, the capacitor C is charged by the pixel data Vd. When the second transistor T2 is conducted, the current I1 (the sensing input signal) is transmitted to the first operational amplifier 530. During sensing phases AI=1 to AI=4, the first voltage ELVDD and the second voltage VTX are switched to function as an input chopper, so that the modulated current I1 is generated and outputted to the first operational amplifier 530. Next, the first operational amplifier 530 amplifies and outputs the modulated sensing input signal Iin to an end of the first output chopper 514. The other end of the first output chopper 514 is coupled to a reference voltage VREF. The first output chopper 514 demodulates the modulated sensing input signal Iin from the first operational amplifier 530 as a DC signal and outputs the demodulated sensing input signal Iin to the filter. Therefore, an offset voltage and a noise signal of the first operational amplifier 530 are reduced.

The second input chopper 522 modulates the demodulated sensing input signal Iin from the first output chopper 514 and outputs the modulated sensing input signal Iin to the second operational amplifier 540. The second operational amplifier 540 receives the modulated sensing input signal Iin from the second input chopper 522 and amplifies and outputs the modulated sensing input signal Iin to the second output chopper 524. The second output chopper 524 demodulates the modulated sensing input signal Iin from the second operational amplifier 540 and outputs the demodulated sensing input signal Iin as a sensing output signal Vout. Therefore, an offset voltage and a noise signal of the second operational amplifier 540 are reduced. In the present embodiment, control signals RST, PH1 and PH2 are configured to control conduction states of corresponding switches.

The sensing output signal Vout is outputted to the signal converter 550. In the present embodiment, the signal converter 550 is an analog-to digital converter (ADC). The signal converter 550 converts the sensing output signal Vout into a digital sensing signal and outputs the digital sensing signal to the compensating circuit 332 for pixel data compensation. When the third transistor T3 decays, the current I1 and the sensing output signal Vout may be respectively changed to the current I1' and the sensing output signal Vout' as shown in FIG. 6. The decay of the third transistor T3 can be measured by the sampling operation of the signal converter 550.

In the present embodiment, the current I1 outputted from the third transistor T3 is taken as an example for the sensing input signal Vin. The operation for sensing the decay current of the organic light-emitting diode D1 can be deduced by analogy, and it will not be further described herein.

Figure 7A:
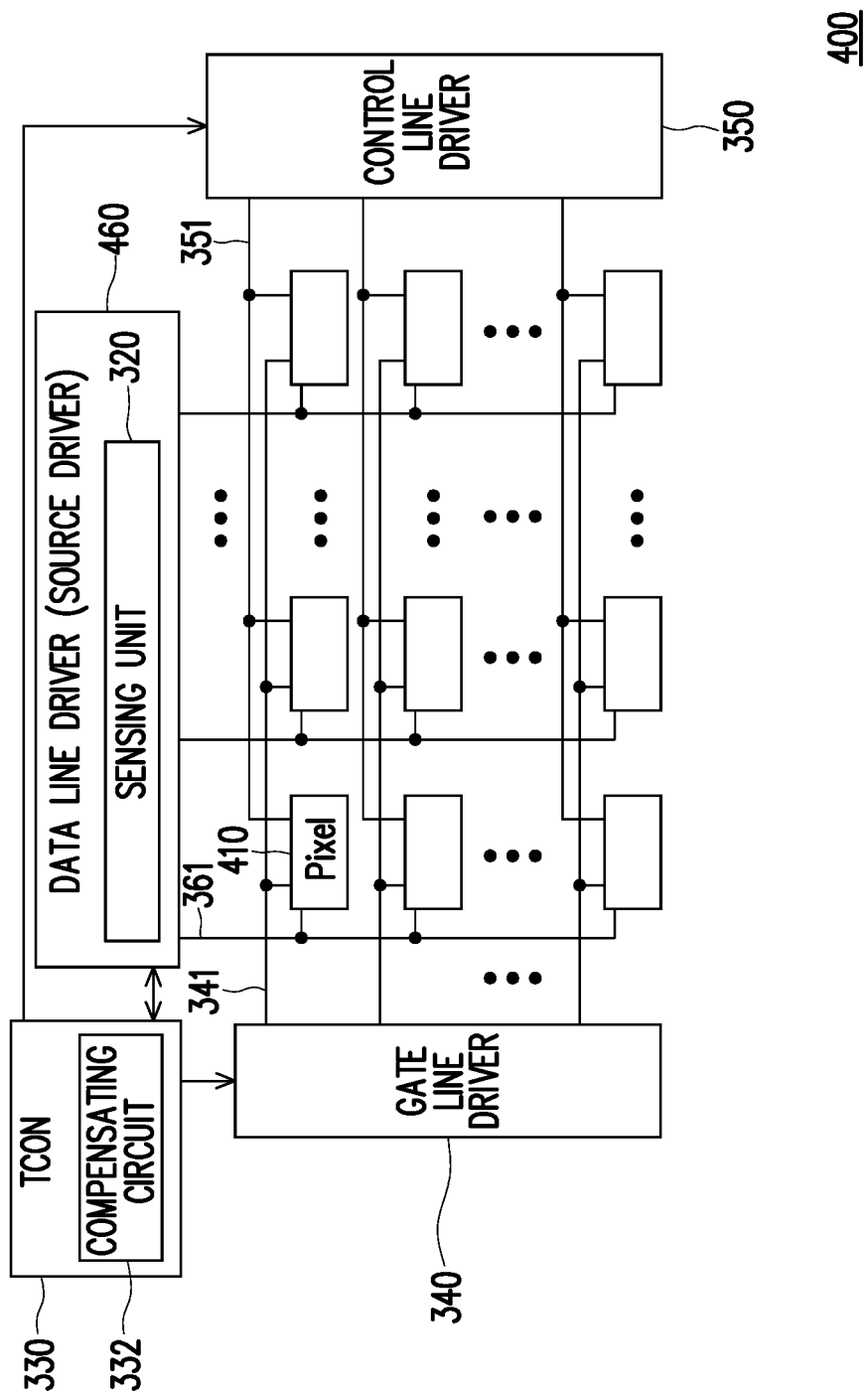
FIG. 7A illustrates a schematic diagram of a display device according to another embodiment of the invention.
Figure 7B:
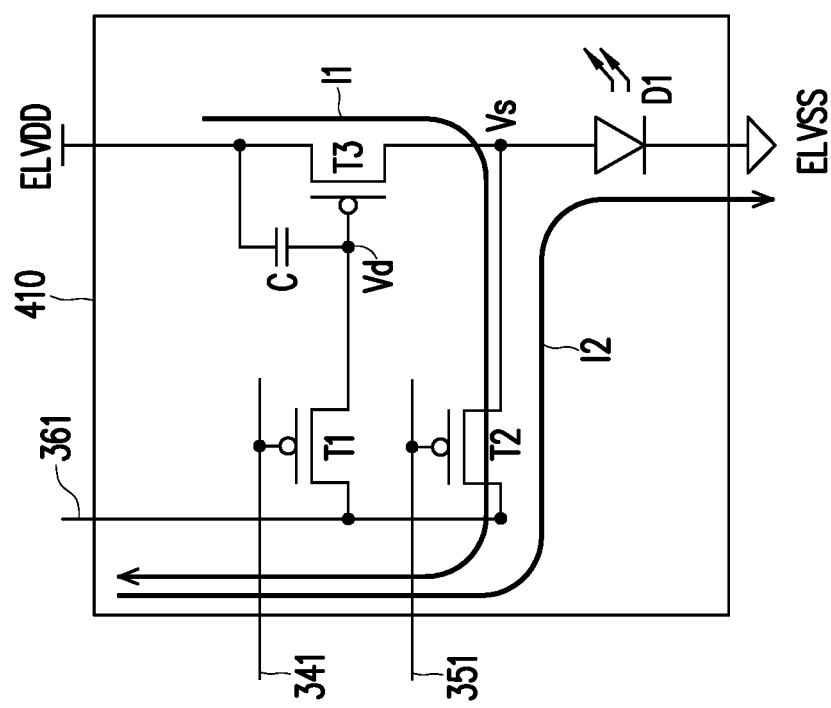
FIG. 7B illustrates a schematic diagram of a pixel depicted in FIG. 7A.

FIG. 7A illustrates a schematic diagram of a display device according to another embodiment of the invention. FIG. 7B illustrates a schematic diagram of a pixel 410 depicted in FIG. 7A. Referring to FIG. 7A and FIG. 7B, the display device 400 of the present embodiment is similar to the display device 300 depicted in FIG. 7A, and the main difference lies in that the sensing unit 320 is disposed in the data line driver 460.

To be specific, the data line driver (the source driver) 460 includes the sensing unit 320. The sensing unit 320 includes one or more sensing circuits. Taking the sensing circuit 200 depicted in FIG. 2 for example, the sensing circuit 200 receives the sensing input signal Vin from the pixel 310 and outputs the sensing output signal Vout2 to the compensating circuit 332 for pixel data compensation. The sensing input signal Vin may be the current I1 outputted from the third transistor T3, the current I2 inputted to the organic light-emitting diode D1 and/or a sensing voltage Vs. The sensing circuit 200 can measure the information of the current I1, the current I2 and/or the sensing voltage Vs. In the present embodiment, the sensing input signal Vin and the pixel data Vd are transmitted in the same signal line, i.e. the data line 361.

Figure 8A:
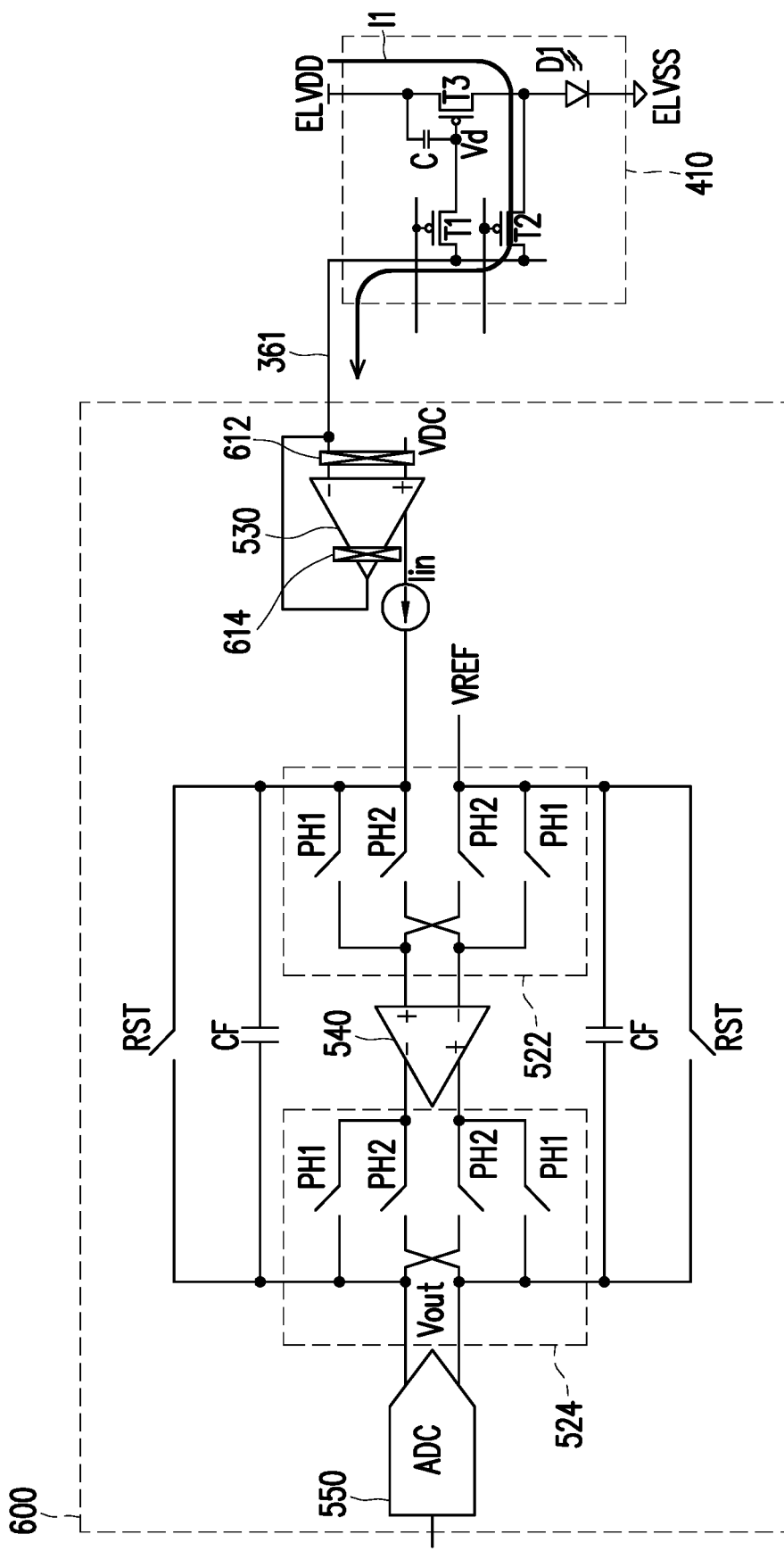
FIG. 8A illustrates a schematic diagram of a sensing circuit for sensing a transistor current according to an embodiment of the invention.
Figure 8B:
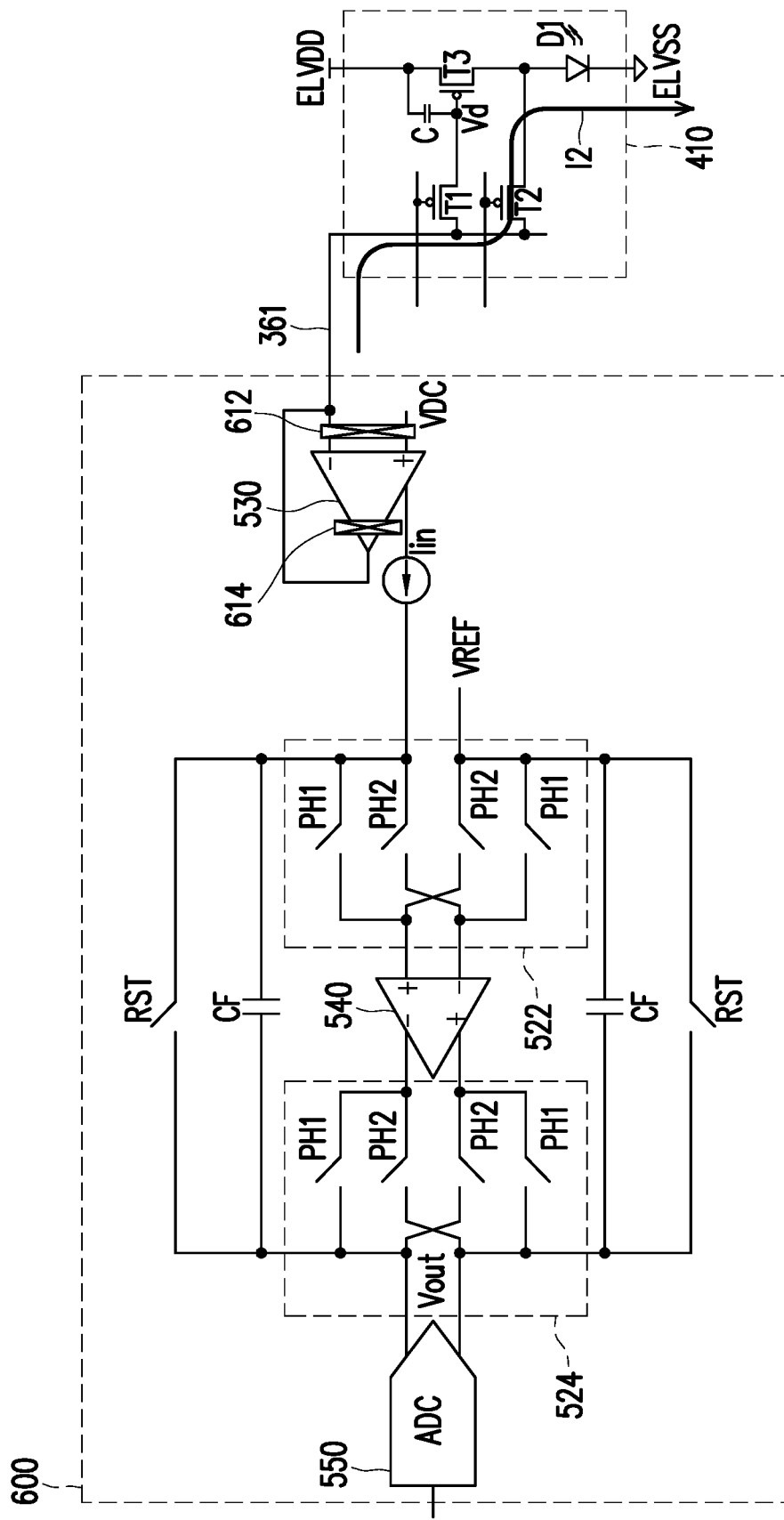
FIG. 8B illustrates a schematic diagram of the sensing circuit depicted in FIG. 8A for sensing a diode current.
Figure 9:
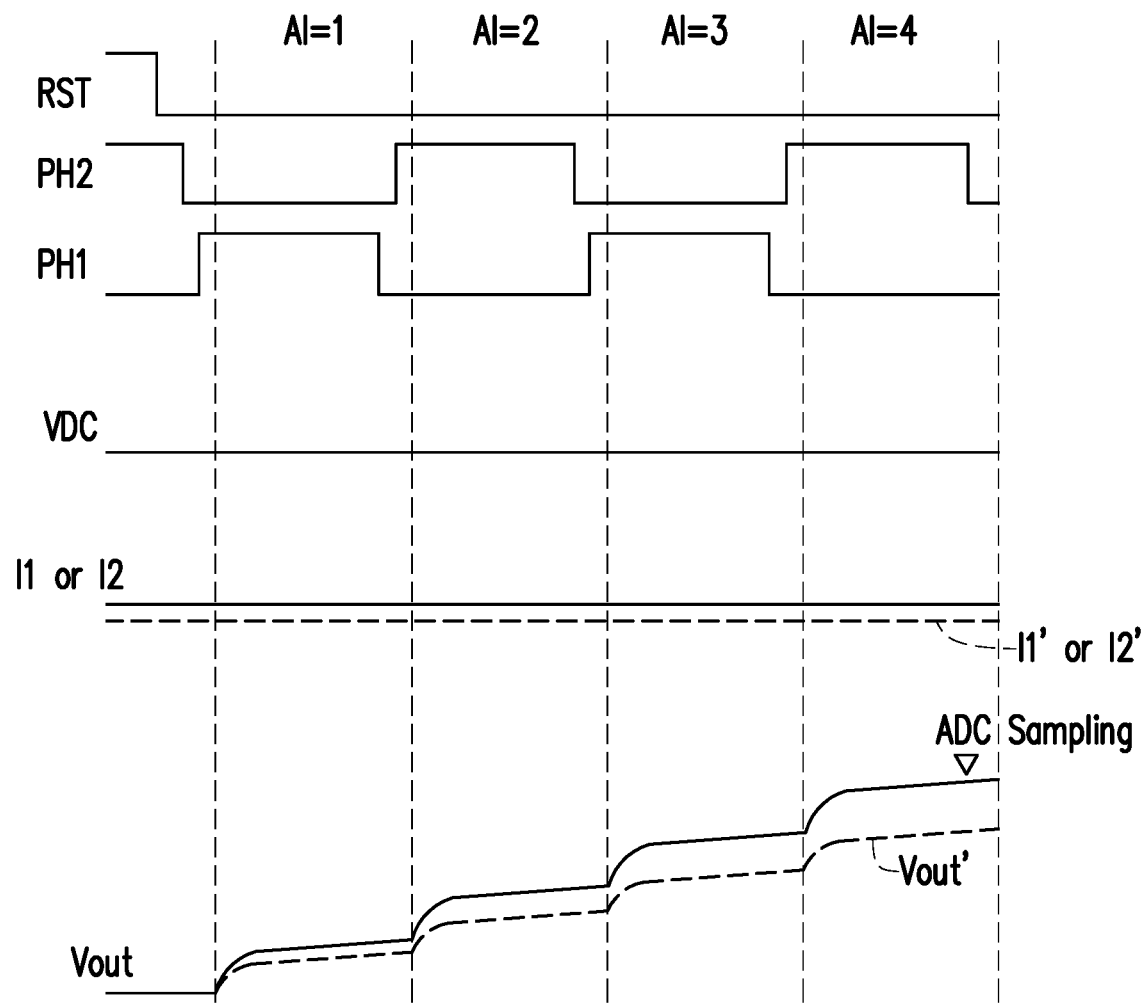
FIG. 9 illustrates waveform diagrams of different signals depicted in FIG. 8A and FIG. 8B.

FIG. 8A illustrates a schematic diagram of a sensing circuit for sensing a transistor current according to an embodiment of the invention. FIG. 8B illustrates a schematic diagram of the sensing circuit depicted in FIG. 8A for sensing a diode current. FIG. 9 illustrates waveform diagrams of different signals depicted in FIG. 8A and FIG. 8B. Referring to FIG. 8A to FIG. 9, the sensing circuit 500 includes a first operational amplifier 530, a first input chopper 612, a first output chopper 614, a second input chopper 522, a second output chopper 524, a second operational amplifier 540 and a signal converter 550. The first operational amplifier 530 is coupled between the first input chopper 612 and the first output chopper 614.

To be specific, the first input chopper 612 modulates the sensing input signal I1 or I2 and outputs the modulated sensing input signal I1 or I2 to the first operational amplifier 530. The first operational amplifier 530 has a first end and a second end. The first end is coupled to a first voltage ELVDD, and the second end is coupled to a second voltage VDC. The first output chopper 614 demodulates the modulated sensing input signal I1 or I2 from the first operational amplifier 530 and outputs the demodulated sensing input signal Iin to the filter. Therefore, an offset voltage and a noise signal of the first operational amplifier 530 are reduced.

In FIG. 8A, the sensing circuit 600 is configured to sense the transistor current I1, i.e. the current I1 outputted from the third transistor T3, for detecting the decay of the third transistor T3. When the first transistor T1 is conducted, the capacitor C is charged by the pixel data Vd. Next, when the first transistor T1 is not conducted (turned off), the pixel data Vd is kept. The second voltage VDC is virtually shorted to the data line 361. When the second transistor T2 is conducted, the voltage of one end of the third transistor T3, i.e. the anode of the organic light-emitting diode D1, is equal to the second voltage VDC. Therefore, the current I1 is outputted from the third transistor T3 and transmitted to the first input chopper 612. By modulation and demodulation of the chopper circuit, the offset voltage and the noise signal of the first operational amplifier 530 are reduced.

In FIG. 8B, the sensing circuit 600 is configured to sense the diode current I2, i.e. the current I2 inputted to the organic light-emitting diode D1, for detecting the decay of the organic light-emitting diode D1. When the first transistor T1 is conducted, the capacitor C is charged by the pixel data Vd, and the pixel data Vd turns off the third transistor T3. Next, when the first transistor T1 is not conducted (turned off), the pixel data Vd is kept and still turns off the third transistor T3. The second voltage VDC is virtually shorted to the data line 361. When the second transistor T2 is conducted, the voltage of one end of the third transistor T3, i.e. the anode of the organic light-emitting diode D1, is equal to the second voltage VDC. In the present embodiment, the second voltage VDC is set to be larger than the voltage ELVSS, so that the organic light-emitting diode D1 can be turned on. Therefore, the current I2 is transmitted via the data line 361 and inputted to the organic light-emitting diode D1. By modulation and demodulation of the chopper circuit, the offset voltage and the noise signal of the first operational amplifier 530 are reduced.

In FIG. 9, when the third transistor T3 or the organic light-emitting diode D1 decays, the current I1 or I2 and the sensing output signal Vout may be respectively changed to the current I1' or I2' and the sensing output signal Vout' as shown in FIG. 9. The decay of the third transistor T3 or the organic light-emitting diode D1 can be measured by the sampling operation of the signal converter 550.

In summary, in the embodiment of the invention, the sensing circuit includes the chopper circuit for modulating and demodulating the sensing input signal from the pixel. The sensing input signal may be a transistor current, a diode current and/or a sensing voltage. The sensing circuit is disposed inside a source driver or outside of the source driver. The sensing input signal is transmitted to the sensing circuit via a data line or a sensing line. Therefore, an offset voltage and a noise signal of the operational amplifier can be reduced, and the sensing circuit is capable of effectively measuring electrical characteristics of pixels.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A sensing circuit of a display device, the sensing circuit comprising:

a chopper circuit, configured to receive a sensing input signal of the display device and modulate the sensing input signal;

a first operational amplifier, coupled to the chopper circuit and configured to receive the modulated sensing input signal and output the modulated sensing input signal to the chopper circuit, wherein the first operational amplifier has a first end and a second end, the first end is coupled to a first voltage and receives the sensing input signal of the display device, and the second end is coupled to a second voltage, wherein the first voltage and the second voltage are switched to modulate the sensing input signal of the display device, wherein the chopper circuit is further configured to demodulate the modulated sensing input signal from the first operational amplifier and output the demodulated sensing input signal; and a filter, coupled to the chopper circuit and configured to filter the demodulated sensing input signal from the chopper circuit and output the filtered sensing input signal as a sensing output signal.

2. The sensing circuit of the display device as claimed in claim 1, wherein the chopper circuit comprises:

a first chopper, configured to receive the sensing input signal of the display device and modulate the sensing input signal; and a second chopper, coupled to the first operational amplifier and configured to demodulate the modulated sensing input signal from the first operational amplifier and output the demodulated sensing input signal to the filter, wherein the first operational amplifier is coupled between the first chopper and the second chopper.

3. The sensing circuit of the display device as claimed in claim 1, wherein the chopper circuit comprises a first output chopper, and the first output chopper demodulates the modulated sensing input signal from the first operational amplifier and outputs the demodulated sensing input signal to the filter.

4. The sensing circuit of the display device as claimed in claim 1, wherein the sensing input signal is outputted from a pixel of the display device via a sensing line of the display device, and the pixel comprises a driving transistor, wherein the sensing input signal is a current outputted from the driving transistor.

5. The sensing circuit of the display device as claimed in claim 3, wherein the chopper circuit further comprises a first input chopper, and the first input chopper modulates the sensing input signal of the display device and outputs the modulated sensing input signal to the first operational amplifier.

6. The sensing circuit of the display device as claimed in claim 5, wherein the sensing input signal is outputted from a pixel of the display device via a data line of the display device, and the pixel comprises a driving transistor and an organic light-emitting diode, wherein the sensing input signal is a current outputted from the driving transistor or a current inputted to the organic light-emitting diode.

7. The sensing circuit of the display device as claimed in claim 3, wherein the chopper circuit further comprises a second input chopper and a second output chopper, and the filter comprises a second operational amplifier coupled between the second input chopper and the second output chopper, the second input chopper modulates the demodulated sensing input signal from the first output chopper and outputs the modulated sensing input signal to the second operational amplifier, the second operational amplifier receives the modulated sensing input signal from the second input chopper and outputs the modulated sensing input signal to the second output chopper, and the second output chopper demodulates the modulated sensing input signal from the second operational amplifier and outputs the demodulated sensing input signal.

8. A source driver of a display device, the source driver comprising:

a sensing circuit, configured to receive a sensing input signal of the display device, and the sensing circuit comprising:

a chopper circuit, configured to receive the sensing input signal of the display device and modulate the sensing input signal;

a first operational amplifier, coupled to the chopper circuit and configured to receive the modulated sensing input signal and output the modulated sensing input signal to the chopper circuit, wherein the first operational amplifier has a first end and a second end, the first end is coupled to a first voltage and receives the sensing input signal of the display device, and the second end is coupled to a second voltage, wherein the first voltage and the second voltage are switched to modulate the sensing input signal of the display device, wherein the chopper circuit is further configured to demodulate the modulated sensing input signal from the first operational amplifier and output the demodulated sensing input signal; and a filter, coupled to the chopper circuit and configured to filter the demodulated sensing input signal from the chopper circuit and output the filtered sensing input signal as a sensing output signal.

9. The source driver of the display device as claimed in claim 8, wherein the chopper circuit comprises:

a first chopper, configured to receive the sensing input signal of the display device and modulate the sensing input signal; and a second chopper, coupled to the first operational amplifier and configured to demodulate the modulated sensing input signal from the first operational amplifier and output the demodulated sensing input signal to the filter, wherein the first operational amplifier is coupled between the first chopper and the second chopper.

10. The source driver of the display device as claimed in claim 8, wherein the chopper circuit comprises a first output chopper, and the first output chopper demodulates the modulated sensing input signal from the first operational amplifier and outputs the demodulated sensing input signal to the filter.

11. The source driver of the display device as claimed in claim 8, wherein the sensing input signal is outputted from a pixel of the display device via a sensing line of the display device, and the pixel comprises a driving transistor, wherein the sensing input signal is a current outputted from the driving transistor.

12. The source driver of the display device as claimed in claim 10, wherein the chopper circuit further comprises a first input chopper, and the first input chopper modulates the sensing input signal of the display device and outputs the modulated sensing input signal to the first operational amplifier.

13. The source driver of the display device as claimed in claim 12, wherein the sensing input signal is outputted from a pixel of the display device via a data line of the display device, and the pixel comprises a driving transistor and an organic light-emitting diode, wherein the sensing input signal is a current outputted from the driving transistor or a current inputted to the organic light-emitting diode.

14. The source driver of the display device as claimed in claim 10, wherein the chopper circuit further comprises a second input chopper and a second output chopper, and the filter comprises a second operational amplifier coupled between the second input chopper and the second output chopper, the second input chopper modulates the demodulated sensing input signal from the first output chopper and outputs the modulated sensing input signal to the second operational amplifier, the second operational amplifier receives the modulated sensing input signal from the second input chopper and outputs the modulated sensing input signal to the second output chopper, and the second output chopper demodulates the modulated sensing input signal from the second operational amplifier and outputs the demodulated sensing input signal.

15. A sensing circuit of a display device, the sensing circuit comprising:

an operational amplifier, configured to receive a sensing input signal of the display device and output the sensing input signal; and a chopper circuit, coupled to the operational amplifier and configured to modulate and demodulate the sensing input signal to reduce an offset voltage and a noise signal of the operational amplifier, wherein the operational amplifier has a first end and a second end, the first end is coupled to a first voltage and receives the sensing input signal of the display device, and the second end is coupled to a second voltage, wherein the first voltage and the second voltage are switched to modulate the sensing input signal of the display device.

16. The sensing circuit of the display device as claimed in claim 15, further comprising:

a filter, coupled to the chopper circuit and configured to filter the sensing input signal from the chopper circuit and output the filtered sensing input signal as a sensing output signal.

17. The sensing circuit of the display device as claimed in claim 15, wherein the sensing input signal is outputted from a pixel of the display device via a data line or a sensing line of the display device, and the pixel comprises a driving transistor and an organic light-emitting diode, wherein the sensing input signal is a current outputted from the driving transistor or a current inputted to the organic light-emitting diode.

18. The sensing circuit of the display device as claimed in claim 15, wherein the sensing circuit is disposed in a source driver of the display device.

* * * * *